US012690143B2

(12) United States Patent
Zhang et al.

(10) Patent No.: US 12,690,143 B2
(45) Date of Patent: Jul. 21, 2026

(54) CABLE CONNECTION DEVICE WITH SIMPLE STRUCTURE

(71) Applicant: Suzhou Luxshare Technology Co., Ltd., Suzhou City (CN)

(72) Inventors: Wanqiang Zhang, Suzhou City (CN); Zhengguo Zhou, Suzhou City (CN)

(73) Assignee: SUZHOU LUXSHARE TECHNOLOGY CO., LTD., Suzhou City (CN)

( * ) Notice: Subject to any disclaimer, the term of this patent is extended or adjusted under 35 U.S.C. 154(b) by 257 days.

(21) Appl. No.: 18/425,762

(22) Filed: Jan. 29, 2024

(65) Prior Publication Data

US 2025/0038389 A1 Jan. 30, 2025

(30) Foreign Application Priority Data

Jul. 24, 2023 (CN) .......................... 202310905838.4

(51) Int. Cl.
| | |
|---|---|
| *H05K 5/00* | (2025.01) |
| *H01P 1/04* | (2006.01) |
| *H01P 5/08* | (2006.01) |
| *H01Q 1/24* | (2006.01) |
| *H01Q 1/50* | (2006.01) |
| *H01R 4/02* | (2006.01) |
| *H01R 12/53* | (2011.01) |
| *H01R 13/02* | (2006.01) |

(52) U.S. Cl.
CPC ............. *H05K 5/0026* (2013.01); *H01Q 1/50* (2013.01); *H01R 4/021* (2013.01); *H01R 4/027* (2013.01); *H01R 2201/02* (2013.01)

(58) Field of Classification Search
CPC .............. H05K 5/0026; H05K 5/0247; H01R 2201/02; H01R 12/53
See application file for complete search history.

(56) References Cited

U.S. PATENT DOCUMENTS

| | | | |
|---|---|---|---|
| 7,418,279 B2 | 8/2008 | Takagi | |
| 2011/0155415 A1* | 6/2011 | Steinich | ............... H02G 15/115 |
| | | | 174/93 |

(Continued)

FOREIGN PATENT DOCUMENTS

| | | | |
|---|---|---|---|
| CN | 208256910 U | * | 12/2018 |
| CN | 208368748 U | | 1/2019 |

(Continued)

*Primary Examiner* — Timothy J Thompson
*Assistant Examiner* — Amol H Patel
(74) *Attorney, Agent, or Firm* — Birch, Stewart, Kolasch & Birch, LLP

(57) ABSTRACT

A cable connection device is configured for connecting a pair of cables in a feed network and includes a feeder box having a cavity and a circuit board located in the cavity. The feeder box includes a bottom wall and at least one side wall. The circuit board has an upper surface and a lower surface opposite to the upper surface. The lower surface is fixedly connected to the bottom wall. The side wall extends from an edge of the bottom wall toward the upper surface and further extends beyond the upper surface. The side wall defines a pair of through holes. The pair of cables pass through the pair of through holes in a one-to-one correspondence manner. The pair of cables are electrically connected to the upper surface of the circuit board.

13 Claims, 8 Drawing Sheets

(56)     References Cited

U.S. PATENT DOCUMENTS

| | | | |
|---|---|---|---|
| 2020/0235025 A1* | 7/2020 | Shimizu ............... | H05K 5/0217 |
| 2023/0387611 A1* | 11/2023 | Sage ................... | H02G 15/113 |

FOREIGN PATENT DOCUMENTS

| | | | |
|---|---|---|---|
| CN | 110571575 A | 12/2019 | |
| CN | 111092287 A | 5/2020 | |
| CN | 114976625 A | 8/2022 | |
| CN | 217691933 U | 10/2022 | |
| CN | 115719892 A | 2/2023 | |
| CN | 220439933 U | 2/2024 | |
| EP | 1 978 591 A1 | 10/2008 | |

* cited by examiner

CABLE CONNECTION DEVICE WITH SIMPLE STRUCTURE

CROSS-REFERENCE TO RELATED APPLICATION

This patent application claims priority of a Chinese Patent Application No. 202310905838.4, filed on Jul. 24, 2023 and titled "CABLE CONNECTION DEVICE", the entire content of which is incorporated herein by reference.

TECHNICAL FIELD

The present disclosure relates to a field of base station antennas, and in particular to a cable connection device.

BACKGROUND

Currently, an existing cable connection device includes a die-casting part, a dielectric layer (Teflon; generally referred to as polytetrafluoroethylene), a feed core and a plastic shell. The existing cable connection device has so many components and is complex to assemble, resulting in high costs. With multi-frequency of the base station antennas and complexity, cost reduction, miniaturization and integration of the feed networks, how to realize connection of the feed networks in a limited space and how to achieve optimal PIM performance indicators and parameter performance indicators in each frequency band, have become the bottleneck of current base station antenna research and development. A cable connection device with ultra-wideband, good electrical performance, small size, low cost and easy welding is particularly important.

SUMMARY

An object of the present disclosure is to provide a cable connection device with a simple structure and therefore, the cable connection device of the present disclosure has low cost.

In order to achieve the above object, the present disclosure adopts the following technical solution: a cable connection device is configured for connecting a pair of cables in a feed network and includes a feeder box having a cavity and a circuit board located in the cavity. The feeder box includes a bottom wall and at least one side wall. The circuit board has an upper surface and a lower surface opposite to the upper surface. The lower surface is fixedly connected to the bottom wall. The side wall extends from an edge of the bottom wall toward the upper surface and further extends beyond the upper surface. The side wall defines a pair of through holes. The pair of cables pass through the pair of through holes in a one-to-one correspondence manner. The pair of cables are electrically connected to the upper surface of the circuit board.

In order to achieve the above object, the present disclosure further adopts the following technical solution: a cable connection device is configured for connecting a pair of cables in a feed network and includes a feeder box having a cavity and a circuit board located in the cavity. The feeder box includes a bottom wall and a plurality of side walls. The circuit board has an upper surface and a lower surface opposite to the upper surface. The lower surface is fixedly connected to the bottom wall. The side walls extend from a plurality of edges of the bottom wall toward the upper surface and further extend beyond the upper surface. The side walls define a pair of through holes. The pair of cables respectively and correspondingly pass through the pair of through holes. The pair of cables are both electrically connected to the upper surface of the circuit board.

Compared with the prior art, the cable connection device of the present disclosure realizes electrical connection of the feed network cables through only two components: the feeder box and the circuit board. The cable connection device of the present disclosure has a simple structure, thereby reducing cost.

DETAILED DESCRIPTION

Figure 1:
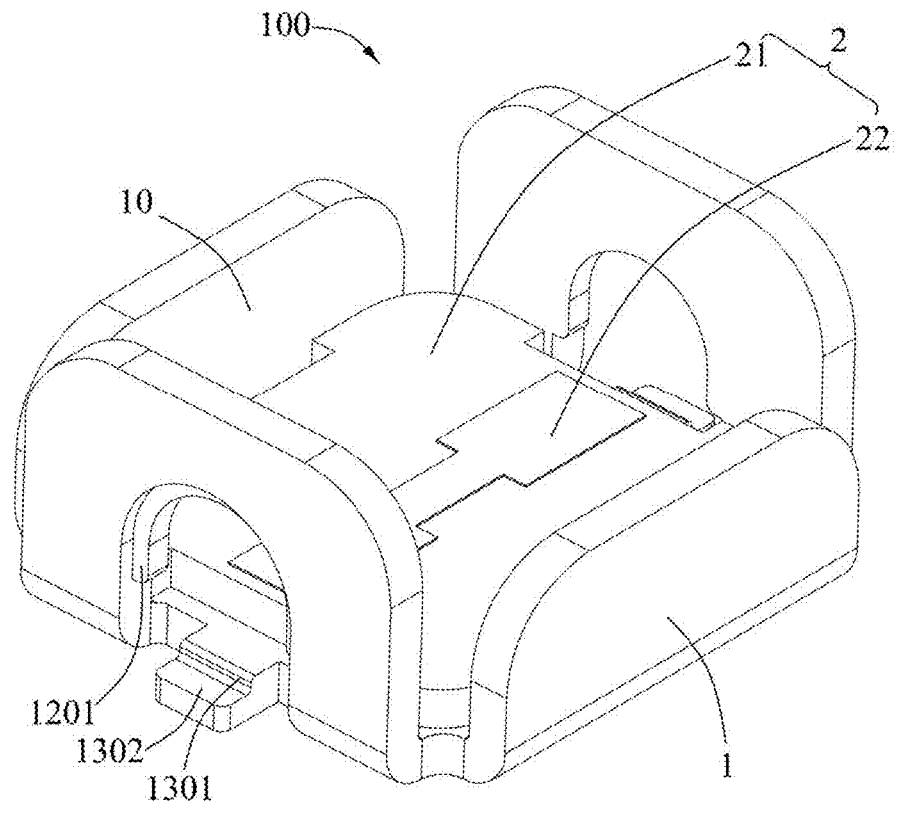
FIG. 1 is a perspective, assembled view of a cable connection device in accordance with a first embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Referring to FIG. 1 to FIG. 6, the present disclosure relates to a cable connection device 100 for connecting a pair of cables 3 in a feed network. The cable connection device 100 includes a feeder box 1 having a cavity 10 and a circuit board 2 located in the cavity 10. The circuit board 2 has an upper surface 201 and a lower surface 202 which is oppositely located with respect to the upper surface 201. The feeder box 1 includes a bottom wall 11 and at least one side wall 12. The lower surface 202 is fixedly connected to the bottom wall 11. The side wall(s) 12 extend(s) from the edge of the bottom wall 11 toward the upper surface 201 and further extend(s) beyond the upper surface 201. The side wall(s) 12 define(s) a pair of through holes 120. The pair of the cables 3 pass through the pair of through holes 120 in a one-to-one correspondence manner and both the cables 3 are electrically connected to the upper surface 201 of the circuit board 2. Therefore, the cable connection device 100 of the present disclosure realizes an electrical connection of the pair of cables 3 in the feed network through only two components: the feeder box 1 and the circuit board 2. The cable connection device 100 of the present disclosure has a simple structure and thus reduces cost.

Figure 6:
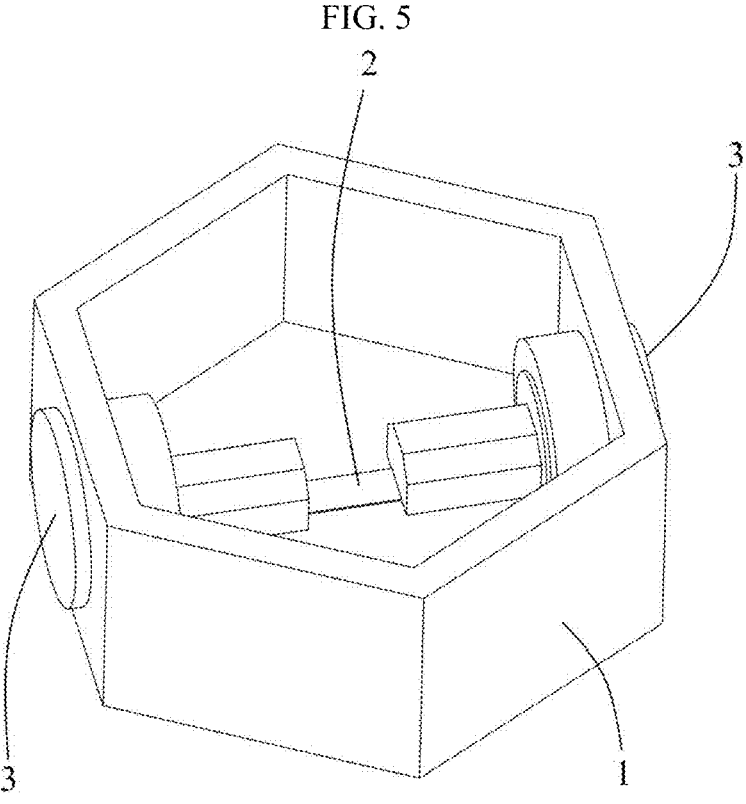
FIG. 6 is a perspective, assembled view of the cable connection device in accordance with a third embodiment of the present disclosure.

Referring to FIG. 1 to FIG. 6, the feeder box 1 is one of a sheet-metaling part and a die-casting part. With reference to a first embodiment shown in FIGS. 1 to 4, the feeder box 1 is a sheet-metaling part. With reference to a second embodiment shown in FIG. 5 and a third embodiment shown in FIG. 6, the feeder box 1 is an integral die-casting part. The cross section of the cavity 10 of the sheet-metaling part shown in FIGS. 1 to 4 has a polygon shape, particularly to a four-sided shape which is so-called a quadrilateral. The cross-section of the cavity 10 of the die-casting part shown in FIG. 5 has a circle shape for instead. The cross-section of the cavity 10 of the die-casting part shown in FIG. 6 also has a polygon shape similar to FIG. 1, but FIG. 6 is particularly to a six-sided shape which is so-called a hexagon.

Referring to the first embodiment as shown in FIG. 1 and the third embodiment as shown in FIG. 6, in which the cross sections of the cavities 10 are both polygons, it can be seen that "polygon" here means that there is a plurality (N) of side walls 12 both in FIGS. 1-4 and FIG. 6. Obviously, in FIGS. 1-4, N=4 and in FIG. 6, N=6. The plurality of side walls 12 are respectively and integrally connected to the bottom wall 11. Since the feeder box 1 in the first embodiment is a sheet-metaling part, sheet-metaling is a comprehensive cold working process for metal sheets (usually below 6 mm) as well-known, and so sheet-metaling is a verb herein. Sheet-metaling refers to some processing actions on a metal plate such as a steel plate, an aluminum plate, a copper plate and others. The abovementioned processing actions include shearing, punching/cutting/compositing, folding, riveting, splicing, forming (such as automobile bodies), etc. The distinctive feature of sheet-metaling is to make the thickness of the same part is consistent. Because sheet-metaling requires "cutting", "folding" and other action processes, during the "cutting", "folding" and other action processes, there will be a gap defined between two adjacent side walls 12. Each of the through holes 120 is located on one of the side walls 12. Since the feeder box 1 in the third embodiment is a die-casting part, die-casting is a metal casting process, which is characterized by using the inner cavity of a mold to apply high pressure to the molten metal, and the mold is usually made of alloy with higher strength. This casting process is somewhat similar to injection molding. Therefore, regardless of the different shapes of die casting (including the circle in FIG. 5 and the polygon in FIG. 6), there is no gap formed in the last two embodiments as described in the first embodiment above.

Figure 2:
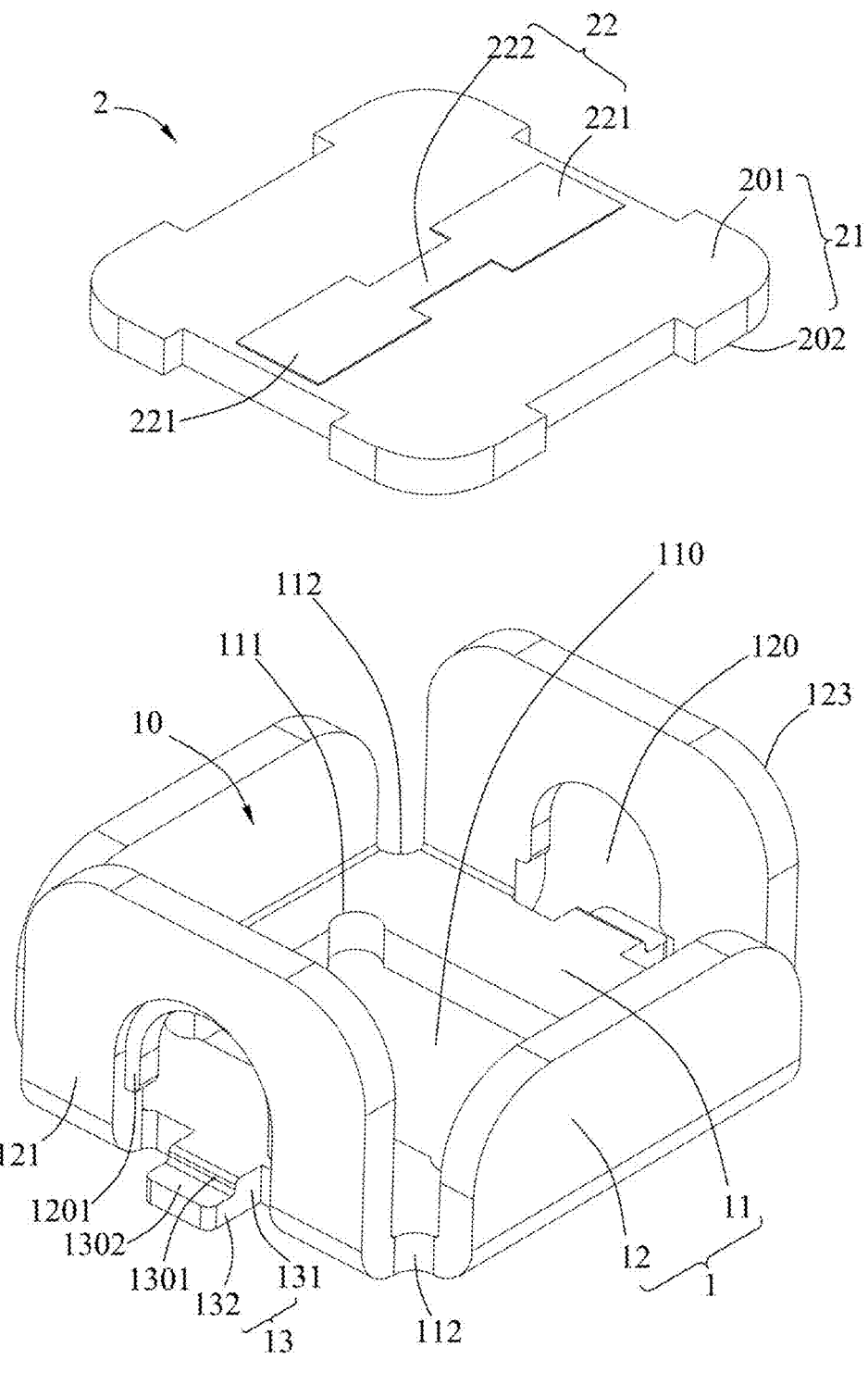
FIG. 2 is a perspective, exploded view of the cable connection device in accordance with the first embodiment of the present disclosure.
Figure 3:
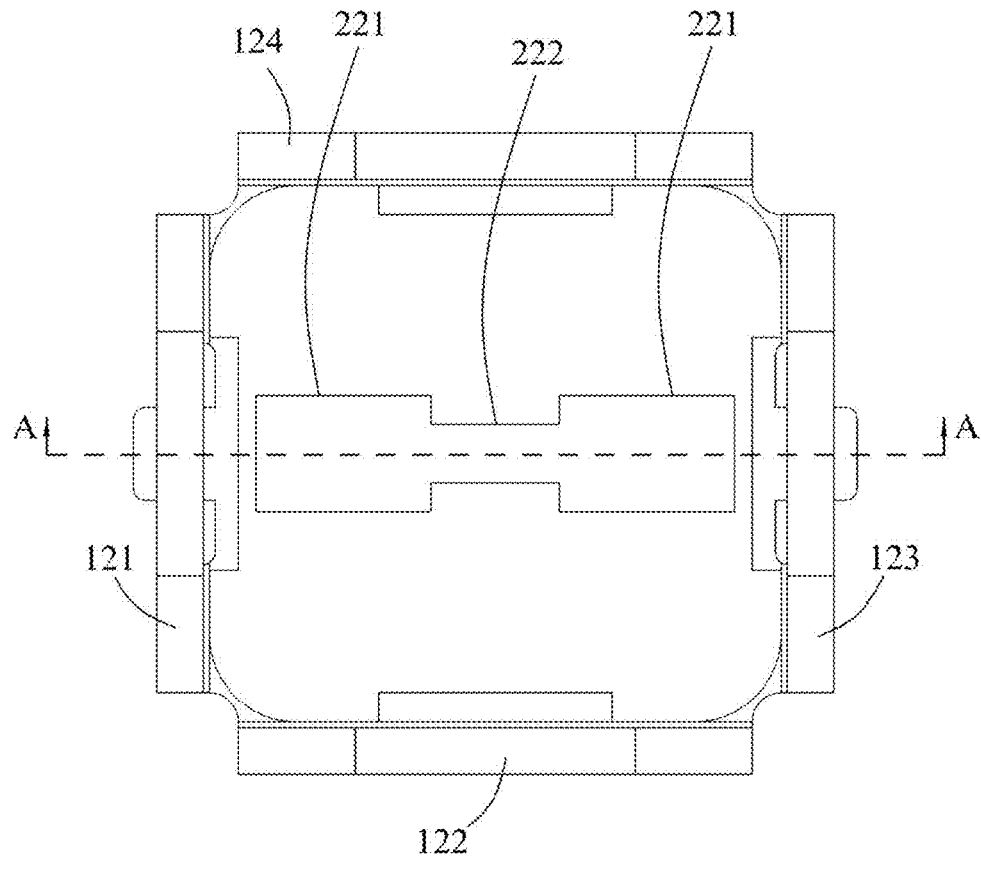
FIG. 3 is a top plane view of the cable connection device of the present disclosure.

Furthermore, the lower surface 202 of the circuit board 2 and the bottom wall 11 are fixedly connected by welding in the first, second and third embodiments of the present disclosure. With Reference to FIG. 2, an opening 110 is defined in the middle part of the bottom wall 11. The function of the opening 110 is that, the opening 110 facilitates the welding operation between the lower surface 202 of the circuit board 2 and the bottom wall 11 and also facilitates effective heat dissipation during the welding process. The bottom wall 11 forms a plurality of first arc-shaped shear ports 111 facing to the opening 110 and a plurality of second arc-shaped shear ports 112 facing away from the opening 110. The first arc-shaped shear ports 111 and the second arc-shaped shear ports 112 are used to avoid stress concentration and reduce deformation caused by external factors (stress, humidity, temperature field changes, etc.).

Referring to FIG. 2 and FIG. 6, in the first and third embodiments, the side walls 12 include at least two groups and each group has two side walls which are oppositely arranged. A pair of the through holes 120 are respectively and correspondingly located on one of the groups of the side walls 12. Particularly shown in FIG. 2, the side walls 12 include a first side wall 121, a second side wall 122, a third side wall 123 and a fourth side wall 124. The first side wall 121 is opposite to the third side wall 123 and the second side wall 122 is opposite to the fourth side wall 124. In another saying, the side walls 12 are divided into two groups. The through holes 120 in FIG. 2 are respectively and correspondingly located on the first side wall 121 and the third side wall 123, which two are oppositely arranged. Particularly shown in FIG. 6, the side walls 12 include a first side wall 121, a second side wall 122, a third side wall 123, a fourth side wall 124, a fifth side wall 125 and a sixth side wall 126. The first side wall 121 is opposite to the fourth side wall 124, the second side wall 122 is opposite to the fifth side wall 125, and the third side wall 123 is opposite to the sixth side wall 126. The through holes 120 in FIG. 6 are respectively and correspondingly located on the first side wall 121 and the fourth side wall 124, which two are oppositely arranged.

Of course, the cross section of the cavity 10 may alternatively have more than six sides. For example, an octagon having eight sides and etc. In fact, N is a positive integer greater than or equal to number 3. From another angle, N is not limited to be an even number, that is, N can also be an odd number. For example, the cross section of the cavity 10 can also be a polygon shape with five sides which is so-called a pentagon or with seven sides which is so-called a heptagon, distinguishing from the four-sided polygon of FIGS. 1-4 and the six-sided polygon of FIG. 6. Even if the five-sided or seven-sided polygon shape is regular with a center, the side walls 12 are not arranged relative to each other in a complete sense, that is, the side walls 12 are not face-to-face arranged. Therefore, each of the two through holes 120 as mentioned above is located on one of the side walls 12, and it is not limited to the two through holes 120 to be located in a manner that, one of the through holes 120 absolutely faces to the other one of the through holes 120. In such a not-absolutely face-to-face condition, it only need to connect a pair of the cables 3 in a staggered manner. Therefore, it is also understood that the pair of cables 3 connected by the cable connection device 100 of the present disclosure are not absolutely on the same straight line.

Figure 4:
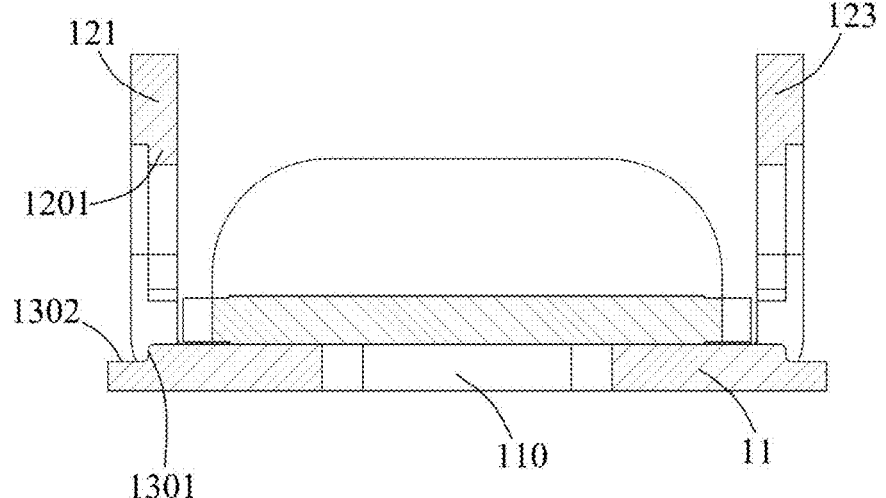
FIG. 4 is a cross-sectional view taken along line A-A in FIG. 3.
Figure 5:
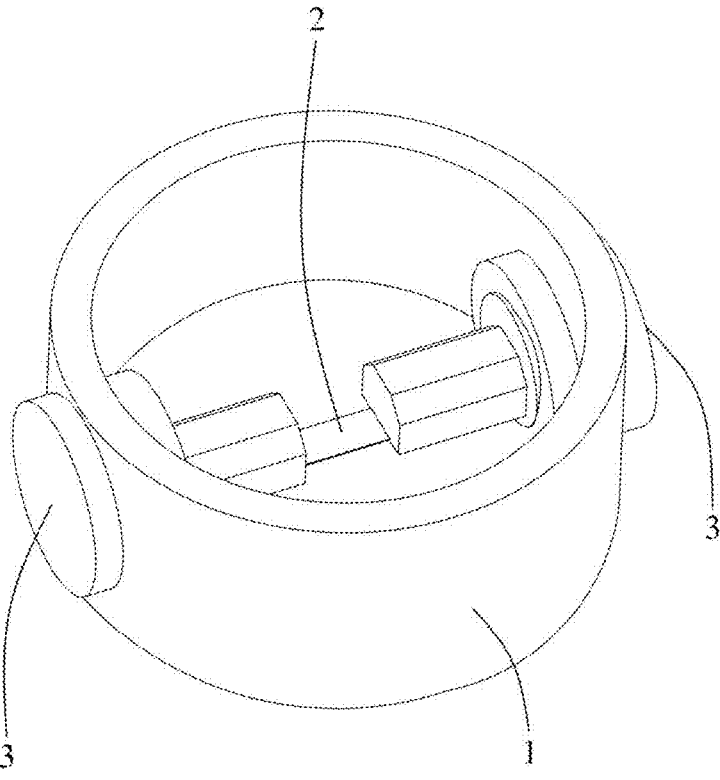
FIG. 5 is a perspective, assembled view of the cable connection device in accordance with a second embodiment of the present disclosure.

Referring to FIG. 2 and FIG. 4, the feeder box 1 has a plurality of ribs 1201. Each rib 1201 protrudes from the inner surface of each through hole 120 for holding the corresponding cable 3. Because the end of the cable 3 needs to expose the conductive core for welding with the circuit board 2, the outer insulation layer of the cable 3 needs to be peeled off to expose the conductive core. The ribs 1201 are correspondingly clamped on a connection position between the peeled position and the unpeeled position of the cable 3 to prevent the cable 3 from being inserted too much or not inserted in place during the assembly process.

Referring to FIG. 1 and FIG. 2, relative to the plane where the bottom wall 11 is located, each rib 1201 has an inverted U shape in the corresponding through hole 120. Each rib 1201 is not coplanar with the corresponding side wall 12 so as to fit in with the circular cross-sectional shape of the cable 3.

Referring to FIG. 1, FIG. 2 and FIG. 4, the feeder box 1 further includes a convex portion 13. The convex portion 13 extends integrally from the bottom wall 11. The convex portion 13 includes a first extension piece 131 and a second extension piece 132. The first extension piece 131 is integrally connected between the bottom wall 11 and the second extension piece 132. In the vertical projection plane of the corresponding side wall 12, the first extension piece 131 is located directly below the rib 1201, and the second extension piece 132 extends beyond the corresponding side wall 12. The convex portion 13 includes a vertical extension surface 1301 extending a certain distance in the thickness direction of the bottom wall 11 to form between the first extension piece 131 and the second extension piece 132. The vertical extension surface 1301 and the rib 1201 are used to hold the cable 3 together. The vertical extension surface 1301 is located below the cable 3 to contact with the connection position between the stripped position and the non-stripped position. The rib 1201 is located above the cable 3 for holding the cable 3 downward. Therefore, the present disclosure not only realizes the effective installation of the cable 3 through the ingenious clamping design which refers to the ribs 1201, preventing the cable 3 from being inserted too much or not in place during the assembly process; but also the present disclosure uses the stepped design which refers to the vertical extension surface 1301, enhancing the clamping and limiting position of the cable 3 and preventing the cable 3 from falling off during the assembly process.

Referring to FIG. 2 and FIG. 4, the second extension piece 132 further includes a horizontal extension surface 1302 lower than the bottom wall 11. The horizontal extension surface 1302 further extends outside the above-mentioned stepped design, and the horizontal extension surface 1302 is used to support the cable 3. Thus, welding during the installation process of the cable 3 is realized by single-person operation, and manpower is saved because multiple people are not required to assist in the operation.

Figure 7:
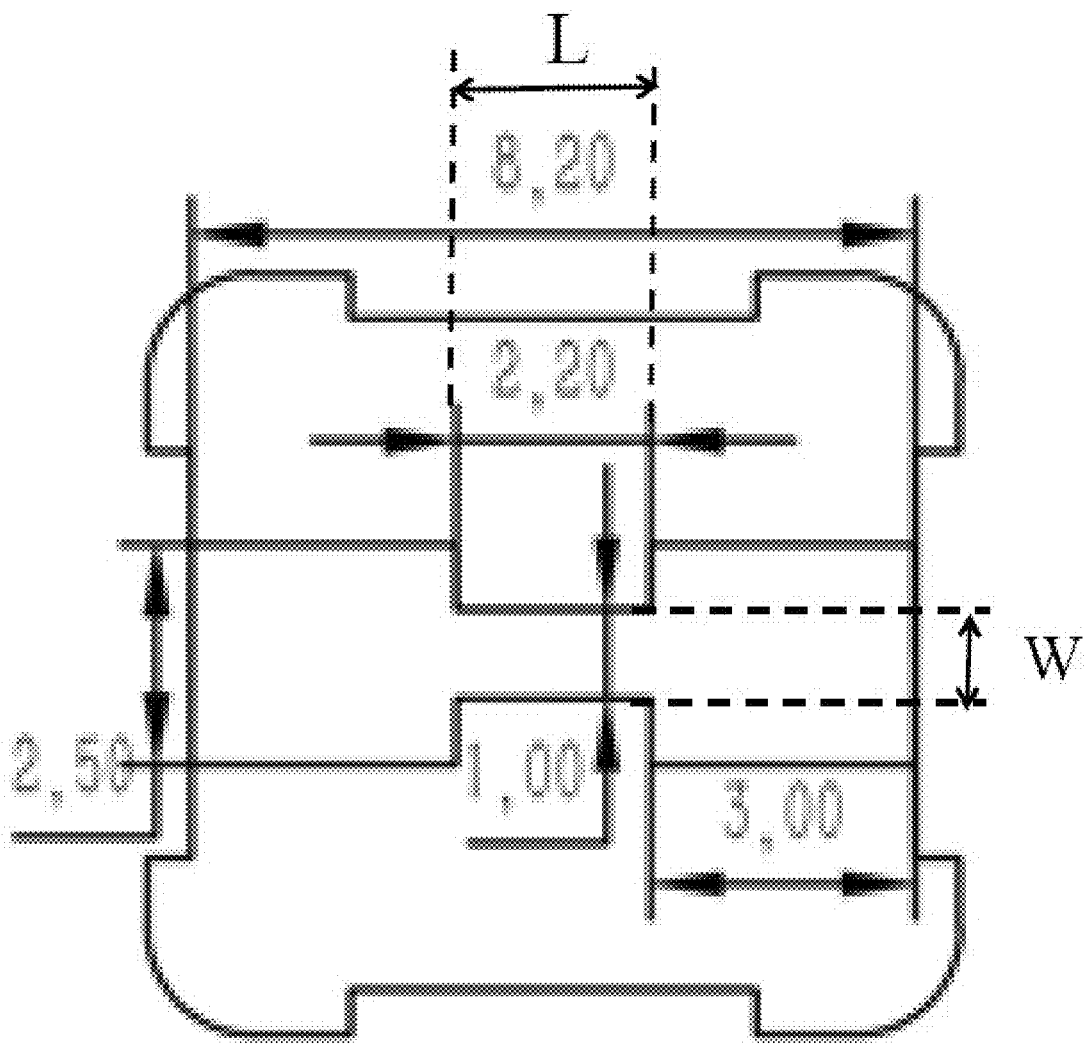
FIG. 7 is a schematic drawing size diagram of the circuit board in the present disclosure.

Referring to FIG. 2, the circuit board 2 includes a base plate 21 and a conductive sheet 22 fixed on the base plate 21. The conductive sheet 22 includes two soldering plates 221 connected to the cables 3 in one-to-one correspondence manner and a microstrip line 222 connected between the two soldering plates 221. With reference to FIG. 7, a length (L)

of the microstrip line is between 0 mm~25 mm and a width (W) of the microstrip line is between 0.4 mm~2.0 mm to achieve ultra-wideband. Generally speaking, in order to achieve a wide bandwidth, the shorter the length of the microstrip line 222, the better. Therefore, in one aspect, the length of the microstrip line 222 can be 0 mm. However, in another aspect, in order to prevent the soldering connection caused by the two soldering plates 221 being too close, the length of the microstrip line 222 cannot be 0 mm. The length of the microstrip line 222 is arranged to 2.2 mm and the width is arranged to 1 mm in the present three embodiments of the present disclosure thereby. The microstrip line 222 within this range can be covered with green oil to achieve solder isolation.

Figure 8:
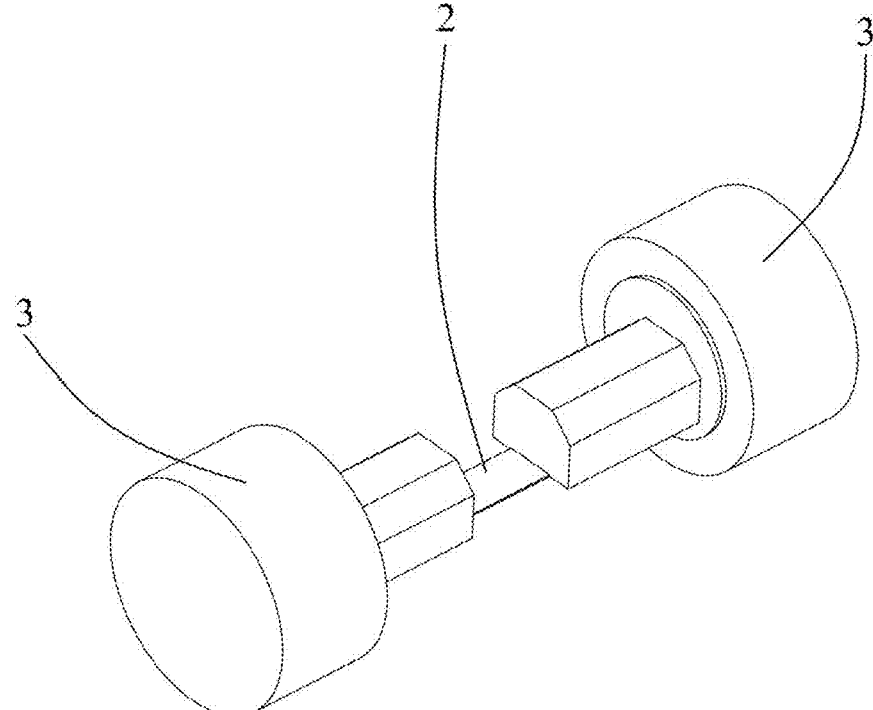
FIG. 8 is a simulation model diagram of the welding of the conductive sheet and the cable in the present disclosure.
Figure 9:
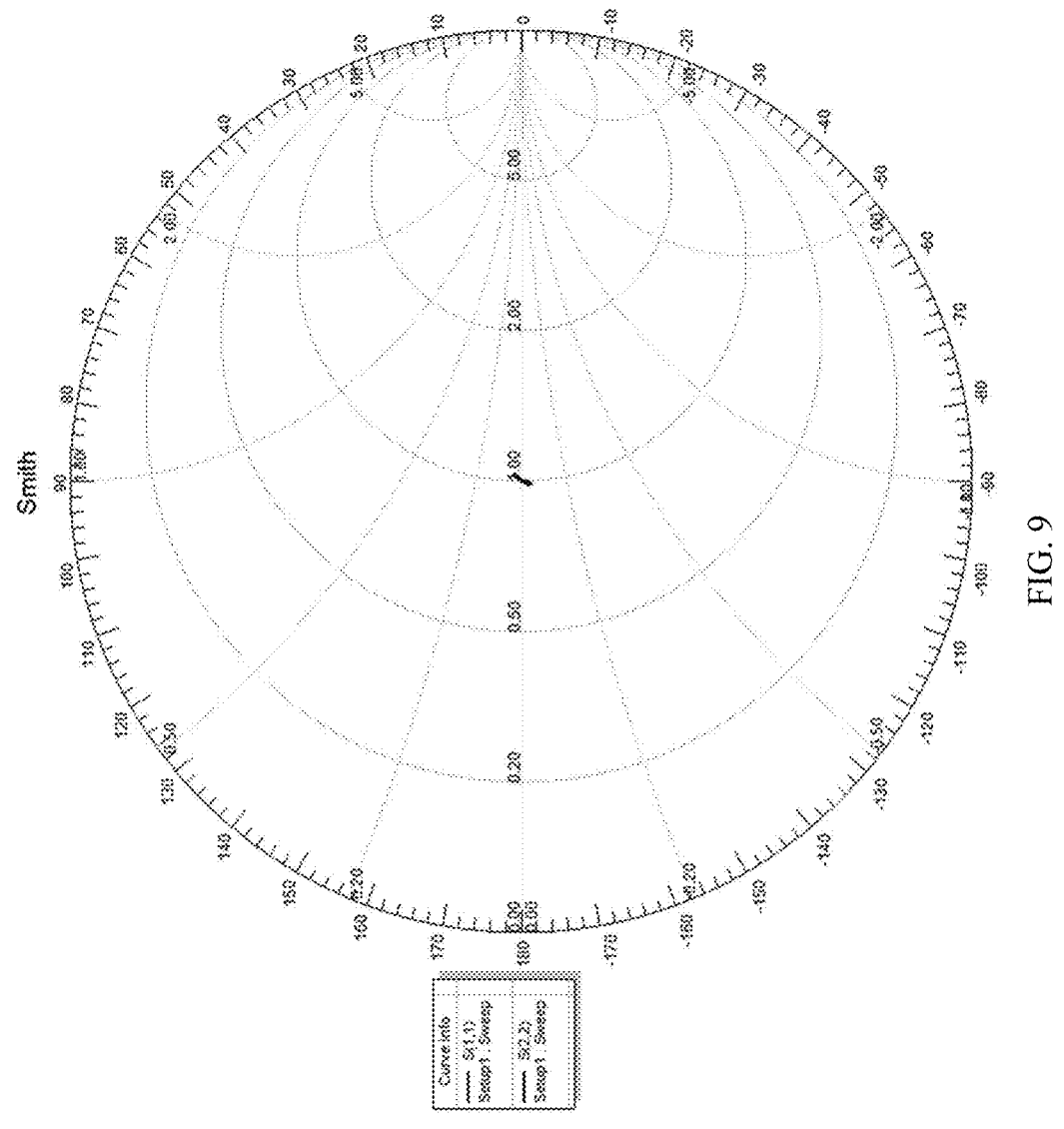
FIG. 9 is a schematic diagram of the Smith chart simulation results of the cable connection device of the present disclosure.
Figure 10:
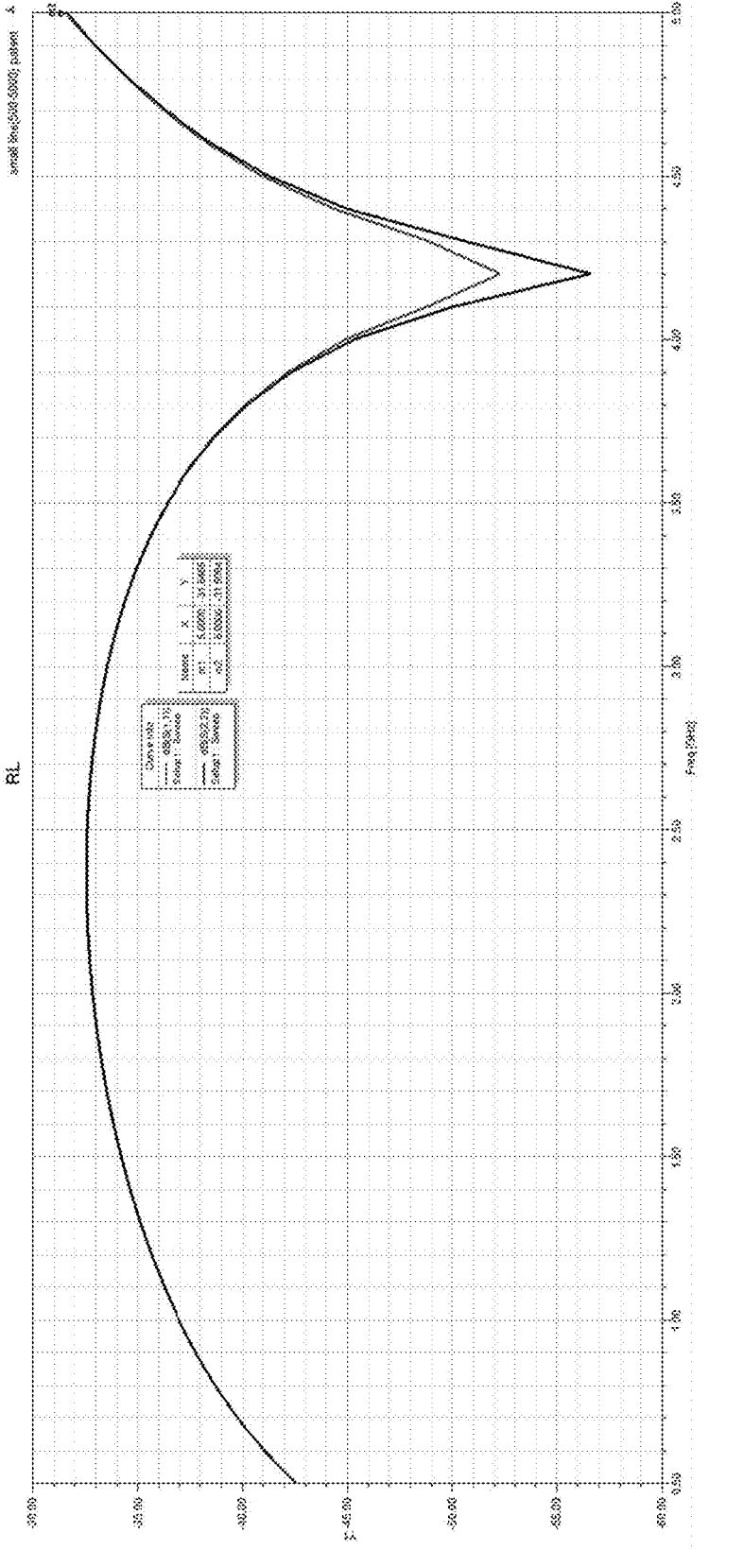
FIG. 10 is a schematic diagram of the return loss simulation results of the cable connection device of the present disclosure.

The welding simulation model of the circuit board 2 and the cable 3 of the present disclosure is shown in FIG. 8. The PCB base material is ZYF300CA 30 mil 1 oz and the frequency band is 500 MHz-5 GHz. It is an ultra-wideband frequency band, covering all frequency bands of 2G, 3G, 4G, and 5G. The disclosed Smith chart simulation results and return loss simulation results are shown in FIG. 9 and FIG. 10 respectively. The Smith chart is very convergent, and the worst value of return loss (Return Loss) in the entire ultra-wideband frequency band is −31.5 Db. It can be seen that because the present disclosure adopts a cable connection device 100 to realize the interconnection between a pair of cables 3 and therefore, the simple structure of the cable connection device 100 of the present disclosure can ensure the realization of high PIM index and high parameter index of the antenna in a limited space.

The cable connection device 100 disclosed in the present disclosure realizes the electrical connection of a pair of cables 3 in the feed network through only two components: the feeder box 1 and the circuit board 2. The cable connection device 100 of the present disclosure has a simple structure and thus reduces cost. The disclosed cable connection device 100 occupies a small space and can ensure that high PIM indicators and therefore, high parameter indicators of the antenna can be achieved in a limited space. The cable connection device 100 of the present disclosure has the beneficial effects of ultra-wideband, high intermodulation, low cost, small size, easy assembly, easy welding, and good assembly consistency.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A cable connection device, configured for connecting a pair of cables in a feed network, comprising:

a feeder box comprising a bottom wall, at least one side wall and a cavity; and a circuit board located in the cavity, the circuit board having an upper surface and a lower surface which is opposite to the upper surface;

wherein the lower surface is fixedly connected to the bottom wall, the side wall extends from an edge of the bottom wall toward the upper surface and further extends beyond the upper surface;

wherein the side wall defines a pair of through holes, the pair of cables pass through the pair of the through holes in a one-to-one correspondence manner, and the pair of cables are electrically connected to the upper surface of the circuit board;

wherein an opening is defined in a middle part of the bottom wall; and wherein the bottom wall forms a plurality of first arc-shaped shear ports facing to the opening and a plurality of second arc-shaped shear ports facing away from the opening.

2. The cable connection device according to claim 1, wherein the feeder box is one of a sheet-metaling part and a die-casting part, wherein a cross section of the cavity of the sheet-metaling part has a shape that is a polygon, and wherein a cross-section of the cavity of the die-casting part has a shape that is a circle or a polygon.

3. The cable connection device according to claim 1, wherein a plurality of side walls is respectively and integrally connected to the bottom wall, there is a gap defined between two adjacent side walls, and each through hole is respectively and correspondingly located on one of the side walls.

4. The cable connection device according to claim 1, wherein the at least one side wall is a plurality of side walls, the plurality of side walls comprise at least two groups, each group has two side walls which are oppositely arranged, and the pair of through holes are respectively and correspondingly located on one of the at least two groups which has oppositely-arranged side walls.

5. The cable connection device according to claim 1, wherein the circuit board comprises a base plate and a conductive sheet fixed on the base plate, the conductive sheet comprises two soldering plates connected to the pair of cables in a one-to-one correspondence manner and a microstrip line connected between the two soldering plates; and wherein a length of the microstrip line is between 0 mm~25 mm and a width of the microstrip line is between 0.4 mm~2.0 mm to achieve ultra-wideband.

6. The cable connection device according to claim 1, wherein the at least one side wall comprises a plurality of side walls, the side walls are respectively and integrally connected to the bottom wall, and wherein one of the through holes is located on one of the side walls and a remaining one of the through holes is located on a remaining one of the side walls.

7. The cable connection device according to claim 6, wherein the feeder box is one of a sheet-metaling part and a die-casting part.

8. The cable connection device according to claim 7, wherein there is a gap formed between two adjacent side walls when the feeder box is the sheet-metaling part.

9. The cable connection device according to claim 7, wherein there is no gap formed between two adjacent side walls when the feeder box is the die-casting part.

10. A cable connection device, configured for connecting a pair of cables in a feed network, comprising:

a feeder box comprising a bottom wall, at least one side wall and a cavity; and a circuit board located in the cavity, the circuit board having an upper surface and a lower surface which is opposite to the upper surface;

wherein the lower surface is fixedly connected to the bottom wall, the side wall extends from an edge of the bottom wall toward the upper surface and further extends beyond the upper surface;

wherein the side wall defines a pair of through holes, the pair of cables pass through the pair of the through holes in a one-to-one correspondence manner, and the pair of cables are electrically connected to the upper surface of the circuit board;

wherein the feeder box comprises a plurality of ribs and each rib protrudes from an inner surface of a corresponding through hole; and wherein each rib has an inverted U shape in the corresponding through hole relative to a plane where the bottom wall is located, and wherein each rib is not coplanar with a corresponding side wall so as to fit in with a circular cross-sectional shape of a corresponding cable.

11. A cable connection device, configured for connecting a pair of cables in a feed network, comprising:

a feeder box comprising a bottom wall, at least one side wall and a cavity; and a circuit board located in the cavity, the circuit board having an upper surface and a lower surface which is opposite to the upper surface;

wherein the lower surface is fixedly connected to the bottom wall, the side wall extends from an edge of the bottom wall toward the upper surface and further extends beyond the upper surface;

wherein the side wall defines a pair of through holes, the pair of cables pass through the pair of the through holes in a one-to-one correspondence manner, and the pair of cables are electrically connected to the upper surface of the circuit board;

wherein the feeder box comprises a plurality of ribs and each rib protrudes from an inner surface of a corresponding through hole;

wherein the feeder box further comprises a convex portion extending integrally from the bottom wall, the convex portion comprises a first extension piece and a second extension piece, the first extension piece is integrally connected between the bottom wall and the second extension piece; and wherein in a vertical projection plane of a corresponding side wall, the first extension piece is located directly below the rib and the second extension piece extends beyond the corresponding side wall.

12. The cable connection device according to claim 11, wherein the convex portion comprises a vertical extension surface extending a certain distance in a thickness direction of the bottom wall, the vertical extension surface is formed between the first extension piece and the second extension piece, while the vertical extension surface and the rib are used to hold a corresponding cable together.

13. The cable connection device according to claim 11, wherein the second extension piece further comprises a horizontal extension surface lower than the bottom wall, and the horizontal extension surface is used to support a corresponding cable.

* * * * *